(12) United States Patent
Song

(10) Patent No.: US 12,243,588 B2
(45) Date of Patent: Mar. 4, 2025

(54) SEMICONDUCTOR MEMORY

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 164 days.

(21) Appl. No.: 17/899,505

(22) Filed: Aug. 30, 2022

(65) Prior Publication Data

US 2023/0133622 A1 May 4, 2023

(30) Foreign Application Priority Data

Oct. 29, 2021 (KR) .......................... 10-2021-0146832

(51) Int. Cl.
 *G11C 11/16* (2006.01)
 *G11C 11/22* (2006.01)
 *G11C 13/00* (2006.01)
(52) U.S. Cl.
 CPC ........ *G11C 13/003* (2013.01); *G11C 11/1659* (2013.01); *G11C 11/1673* (2013.01); *G11C 11/1675* (2013.01); *G11C 11/2259* (2013.01); *G11C 11/2273* (2013.01); *G11C 11/2275* (2013.01); *G11C 13/004* (2013.01); *G11C 13/0069* (2013.01); *G11C 2213/79* (2013.01)
(58) Field of Classification Search
 CPC .............. G11C 13/003; G11C 11/1659; G11C 11/1673; G11C 11/1675; G11C 11/2259; G11C 11/2273; G11C 11/2275; G11C 13/004; G11C 13/0069
 See application file for complete search history.

(56) References Cited

U.S. PATENT DOCUMENTS

| 2010/0103718 A1* | 4/2010 | Asao .................... G11C 11/1659 |
| | | 365/171 |
| 2011/0222334 A1* | 9/2011 | Aoki .................... G11C 11/1673 |
| | | 365/158 |
| 2019/0006415 A1* | 1/2019 | Li ......................... G11C 11/1673 |
| 2020/0058339 A1* | 2/2020 | Hong .................... G06N 3/049 |
| 2022/0189523 A1* | 6/2022 | Gupta ................. G11C 11/1675 |

FOREIGN PATENT DOCUMENTS

| KR | 20170137562 A | 12/2017 |
| KR | 20200003732 A | 1/2020 |

OTHER PUBLICATIONS

Kim, Y. et al., "Multilevel Spin-Orbit Torque MRAMs." IEEE Transactions on Electron Devices, vol. 62, No. 2, Feb. 2015, pp. 561-568.

* cited by examiner

*Primary Examiner* — Min Huang
(74) *Attorney, Agent, or Firm* — Perkins Coie LLP

(57) ABSTRACT

A semiconductor memory may include: a first variable resistance element including a first terminal and a second terminal; a second variable resistance element including a first terminal, a second terminal, and a third terminal; a first transistor configured to control an electrical connection between a first conductive line and the first terminal of the first variable resistance element; a second transistor configured to control an electrical connection between the first conductive line and the first terminal of the second variable resistance element; a connection layer structured to electrically connect the second terminal of the first variable resistance element to the second and third terminals of the second variable resistance element; and a third conductive line is electrically connected to the connection layer.

15 Claims, 10 Drawing Sheets

SEMICONDUCTOR MEMORY

PRIORITY CLAIM AND CROSS-REFERENCE TO RELATED APPLICATION

This patent document claims the priority and benefits of Korean Patent Application No. 10-2021-0146832 filed on Oct. 29, 2021, which is incorporated herein by reference in its entirety.

TECHNICAL FIELD

This patent document relates to memory circuits or devices.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high-capacity semiconductor devices include memory devices that can store data by switching between different resistance states according to an applied voltage or current, for example, an RRAM (resistive random access memory), a PRAM (phase change random access memory), an FRAM (ferroelectric random access memory), an MRAM (magnetic random access memory), an electronic fuse (E-fuse).

SUMMARY

The disclosed technology in this patent document includes various embodiments of a semiconductor memory that has excellent operating characteristics and can be highly integrated.

In an embodiment, a semiconductor memory includes: a first variable resistance element including a first terminal and a second terminal; a second variable resistance element including a first terminal, a second terminal, and a third terminal; a first transistor configured to control an electrical connection between a first conductive line and the first terminal of the first variable resistance element; a second transistor configured to control an electrical connection between the first conductive line and the first terminal of the second variable resistance element; a connection layer structured to electrically connect the second terminal of the first variable resistance element to the second and third terminals of the second variable resistance element; and a second conductive line is electrically connected to the connection layer.

In another embodiment, a semiconductor memory includes: a first transistor including a first gate electrode that is disposed over a substrate; a second transistor including a second gate electrode that is disposed over the substrate; a first variable resistance element disposed over the substrate and electrically connected to a first terminal of the first transistor; a second variable resistance element disposed over the substrate and electrically connected to a first terminal of the second transistor; a source line disposed over the substrate and electrically connected in common to a second terminal of the first transistor and a second terminal of the second transistor; a connection layer disposed over the first and second variable resistance elements and electrically connected to the first variable resistance element while being in contact with an entire upper surface of the second variable resistance element; a bit line disposed over the connection layer and electrically connected to the connection layer; a first contact plug structured to connect the source line to the second terminal of the first transistor and the second terminal of the second transistor; a second contact plug structured to connect the first variable resistance element to the first terminal of the first transistor; a third contact plug structured to connect the second variable resistance element to the first terminal of the second transistor; and a fifth contact plug structured to connect the bit line to the connection layer.

DETAILED DESCRIPTION

Figure 1:
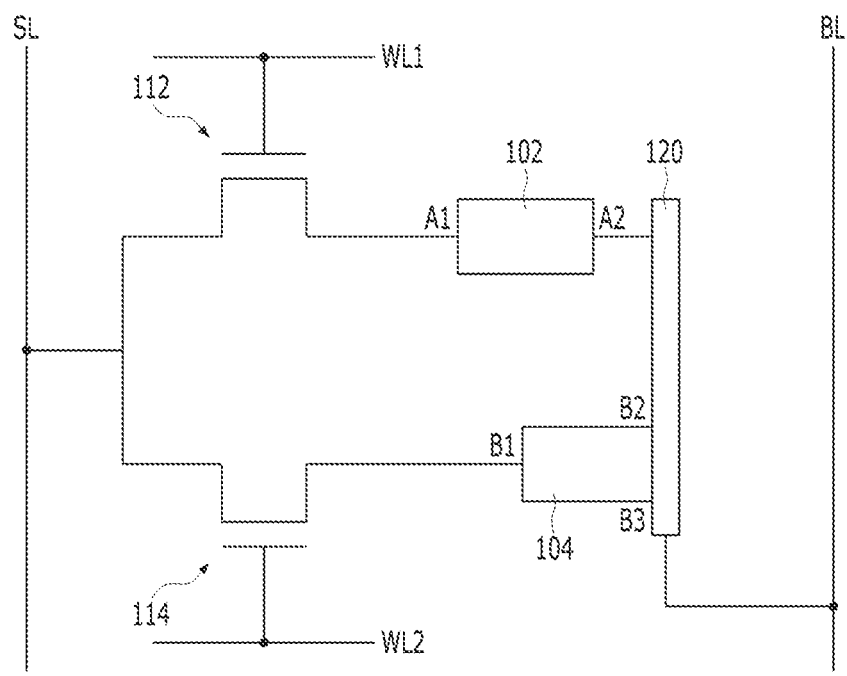
FIG. 1 illustrates a memory cell based on some embodiments of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 illustrates a memory cell based on some embodiments of the disclosed technology.

Referring to FIG. 1, the memory cell based on some embodiments of the disclosed technology may include a first variable resistance element 102, a second variable resistance element 104, a first transistor 112, and a second transistor 114.

Each of the first variable resistance element 102 and the second variable resistance element 104 may store different data values by switching its resistance between different resistance states in response to an applied voltage or current. As an example, each of the first variable resistance element 102 and the second variable resistance element 104 may store data corresponding to a logic high state '1' by having a first resistance state, for example, a low resistance state, or may store data corresponding to a logic low state '0' by having a second resistance state distinguishable from the first resistance state, for example, a high resistance state.

Here, the first variable resistance element 102 may have two terminals of a first terminal A1 and a second terminal A2, and may be programmed or read through these two terminals. In some implementations, a variable resistance element is "programmed" when data is written to the variable resistance element. That is, the first variable resistance element 102 may switch between different resistance states according to a voltage or current applied through the first and second terminals A1 and A2. Here, different resistance states indicate different data values, and the resistance states can be detected by a circuit that can detect voltages and/or currents. The first variable resistance element 102 may have a single-layered structure or a multi-layered structure including various materials that can be used in RRAM, PRAM, FRAM, MRAM, etc., for example, a metal oxide such as a transition metal oxide or a perovskite-based material, a phase change material such as a chalcogenide-based material, ferroelectric material, a ferromagnetic material, or others. In an implementation where the first variable resistance element 102 includes a ferromagnetic material, the first variable resistance element 102 may be programmed by a spin transfer torque (STT) method, and in such a case, the first variable resistance element 102 includes an STT element. For example, any one of the elements illustrated in FIGS. 2A to 2C may be used as the first variable resistance element 102.

Figure 2A:
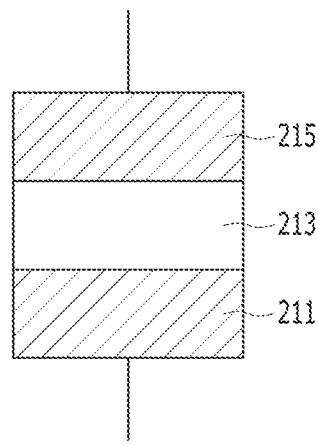
FIG. 2A illustrates an example of a first variable resistance element of FIG. 1.

FIG. 2A illustrates an example of a first variable resistance element of FIG. 1.

Referring to FIG. 2A, the variable resistance element based on some embodiments of the disclosed technology may include a first electrode layer 211, a second electrode layer 215, and a variable resistance material layer 213 interposed between the first electrode layer 211 and the second electrode layer 215.

The first electrode layer 211 and the second electrode layer 215 may be positioned at both ends, for example, at lower and upper ends of the variable resistance element, respectively, and may function to transmit a voltage or current required for the operation of the variable resistance element. The first electrode layer 211 and/or the second electrode layer 215 may include various conductive materials, for example, a metal such as platinum (Pt), tungsten (W), aluminum (Al), copper (Cu), tantalum (Ta), titanium (Ti), or others, a metal nitride such as titanium nitride (TiN), tantalum nitride (TaN), or others, or a combination thereof. One of the first electrode layer 211 and the second electrode layer 215 may correspond to the first terminal A1 of the first variable resistance element 102 of FIG. 1, and the other of the first electrode layer 211 and the second electrode layer 215 may correspond to the second terminal A2 of the first variable resistance element 102 of FIG. 1.

The variable resistance material layer 213 may include a metal oxide that can be used in RRAM, a phase change material that can be used in PRAM, or a ferroelectric material that can be used in FRAM. The variable resistance material layer 213 may have a single-layered structure or a multi-layered structure. In an implementation where the variable resistance material layer 213 includes a phase change material, the variable resistance material layer 213 may have different resistance states by switching between a crystalline phase and an amorphous phase. In an implementation where the variable resistance material layer 213 includes a metal oxide, the variable resistance material layer 213 may have different resistance states depending on whether or not a conductive path is formed by metal ions or oxygen vacancies in the metal oxide. In an implementation where the variable resistance material layer 213 includes a ferroelectric material, the variable resistance material layer 213 may have different resistance states depending on the polarization direction and/or the polarization state of the ferroelectric material.

Figure 2B:
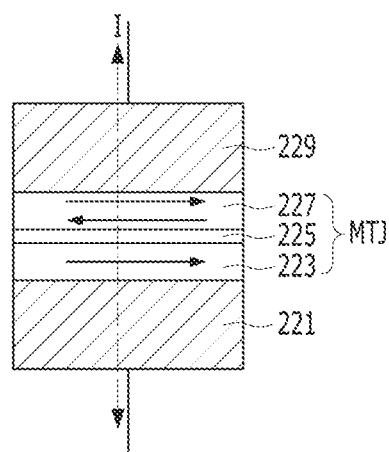
FIG. 2B illustrates another example of a first variable resistance element of FIG. 1.

FIG. 2B illustrates another example of a first variable resistance element of FIG. 1.

Referring to FIG. 2B, the variable resistance element based on some embodiments of the disclosed technology may include a first electrode layer 221, a second electrode layer 229, and a magnetic tunnel junction (MTJ) structure interposed between the first electrode layer 221 and the second electrode layer 229 and including a pinned layer 223, a tunnel barrier layer 225, and a free layer 227.

The pinned layer 223 may have a fixed magnetization direction. For example, in an embodiment, as indicated by an arrow in the pinned layer 223, the pinned layer 223 may have a certain magnetization direction parallel to the surface of the pinned layer 223 (e.g., from left to right in FIG. 2B). In another embodiment, the pinned layer 223 may have a magnetization direction opposite to the magnetization direction of the pinned layer 223 (e.g., from right to left in FIG. 2B). The free layer 227 may have a variable magnetization direction. For example, as indicated by arrows in the free layer 227, the free layer 227 may have a magnetization direction parallel to the surface of the free layer 227 (e.g., from left to right or from right to left in FIG. 2B). The pinned layer 223 and the free layer 227 may have a single-layered structure or a multi-layered structure including various ferromagnetic materials, for example, Fe—Pt alloy, Fe—Pd alloy, Co—Pd alloy, Co—Pt alloy, Fe—Ni—Pt alloy, Co—Fe—Pt alloy, Co—Ni—Pt alloy, or others. The tunnel barrier layer 225 may be interposed between the pinned layer 223 and the free layer 227, and may allow tunneling of electrons to change the magnetization direction of the free layer 227, if necessary, for example, during a program operation that changes the resistance state of the variable resistance element. The tunnel barrier layer 225 may have a single-layered structure or a multi-layered structure including an oxide such as MgO, CaO, SrO, TiO, VO, NbO, or others.

Here, the variable resistance element based on some embodiments of the disclosed technology may be an STT element. That is, the magnetization direction of the free layer 227 may be changed by a program current I passing through the variable resistance element. Accordingly, the magnetization direction of the free layer 227 and the magnetization direction of the pinned layer 223 may be parallel or anti-parallel. When the magnetization direction of the free layer 227 and the magnetization direction of the pinned layer 223 are parallel to each other, the variable resistance element may have a low resistance state. Conversely, when the magnetization direction of the free layer 227 and the magnetization direction of the pinned layer 223 are anti-parallel, the variable resistance element may have a high resistance state.

Figure 2C:
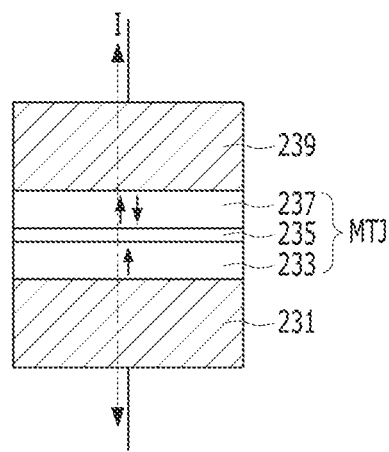
FIG. 2C illustrates another example of a first variable resistance element of FIG. 1.

FIG. 2C illustrates yet another example of a first variable resistance element of FIG. 1.

Referring to FIG. 2C, the variable resistance element based on some embodiments of the disclosed technology may include a first electrode layer 231, a second electrode layer 239, and a magnetic tunnel junction (MTJ) structure interposed between the first electrode layer 231 and the second electrode layer 239 and including a pinned layer 233, a tunnel barrier layer 235, and a free layer 237.

The variable resistance element based on some embodiments of the disclosed technology may also be an STT element, like the variable resistance element of FIG. 2B. That is, the magnetization direction of the free layer 237 may be changed to be parallel to the magnetization direction of the pinned layer 233 or to be anti-parallel to the magnetization direction of the pinned layer 233, by a program current I passing through the variable resistance element. However, the difference from the variable resistance element of FIG. 2B may be that the magnetization directions of the pinned layer 233 and the free layer 237 are perpendicular to the surfaces of the pinned layer 233 and the free layer 237 as indicated by the arrows in the pinned layer 233 and the free layer 237. In an embodiment, the pinned layer 233 may have a certain magnetization direction perpendicular to the surfaces of the pinned layer 233 and the free layer 237 (e.g., from bottom to top in FIG. 2C). In another embodiment, the pinned layer 233 may have a magnetization direction opposite to the magnetization direction of the pinned layer 233 (e.g., from top to bottom in FIG. 2C). The free layer 237 may have a magnetization direction from top to bottom or from bottom to top.

Referring back to FIG. 1, the first terminal A1 of the first variable resistance element 102 may be connected to the source line SL through the first transistor 112. That is, the first transistor 112 may control the electrical connection between the first variable resistance element 102 and the source line SL. The gate of the first transistor 112 may be connected to the first word line WL1, and may be turned on or turned off according to a voltage applied to the first word line WL1. The second terminal A2 of the first variable resistance element 102 may be connected to the bit line BL through the connection layer 120.

The second variable resistance element 104 may have three terminals of a first terminal B1, a second terminal B2, and a third terminal B3, and may be programmed through two terminals selected from the three terminals or read through the other two terminals selected from the three terminals. As an example, the second variable resistance element 104 may switch between different resistance states according to a voltage or current applied through the second and third terminals B2 and B3, and the resistance state thereof may be sensed according to a voltage or current applied through the first and third terminals B1 and B3. As an example, the second variable resistance element 104 may include an element that is programmed by a spin orbit torque (SOT) method, that is, an SOT element, in which a current carrying spin-orbit torque (SOT) charge carriers is injected to flow through the MTJ to facilitate flipping the magnetization of the free layer of the MTJ. For example, the element illustrated in FIG. 3 may be used as the second variable resistance element 104.

Figure 3:
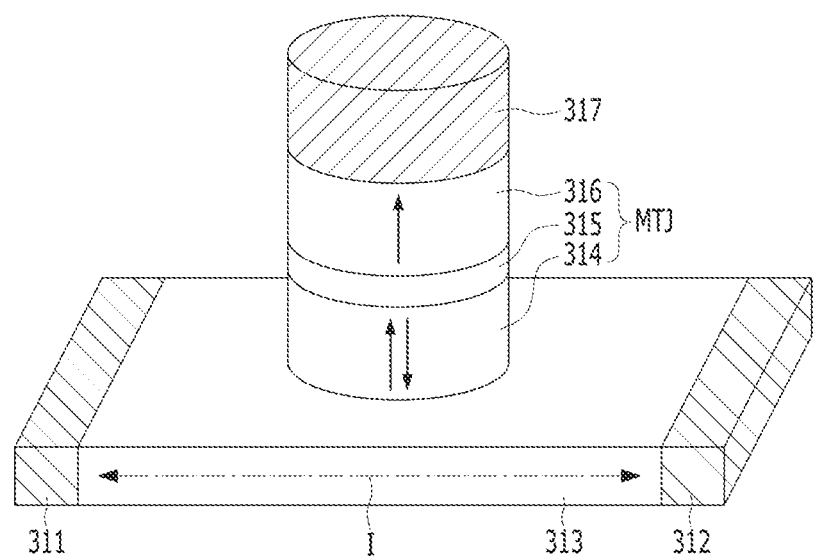
FIG. 3 illustrates an example of a second variable resistance element of FIG. 1.

FIG. 3 illustrates an example of a second variable resistance element of FIG. 1 based on some embodiments of the disclosed technology.

Referring to FIG. 3, the variable resistance element may include a first electrode layer 311, a second electrode layer 312, a conductive layer 313 interposed between the first electrode layer 311 and the second electrode layer 312, a magnetic tunnel junction (MTJ) structure disposed over the conductive layer 313 and including a free layer 314, a tunnel barrier layer 315, and a pinned layer 316, and a third electrode layer 316 disposed over the magnetic tunnel junction (MTJ) structure. In some implementations, the conductive layer 313 may be formed of a heavy metal or ferromagnet oxide material, in which a spin current generated by the spin Hall effect or the Rashba effect exerts a spin orbit torque (SOT) on the free layer 314 to manipulate the magnetization of the free layer 314 in a MTJ connected in a 3 terminal configuration as shown in FIG. 3 where the conductive path across the MTJ between the terminal 317 and one of the terminals 311 and 312 provides another spin polarized current to provide spin torque transfer (STT) to the magnetization of the free layer 314.

One of the first electrode layer 311 and the second electrode layer 312 may correspond to the second terminal B2 of the second variable resistance element 104 of FIG. 1, and the other of the first electrode layer 311 and the second electrode layer 312 may correspond to the third terminal B3 of the second variable resistance element 104 of FIG. 1. The conductive layer 313 may correspond to a portion of the connection layer 120 of FIG. 1, for example, a portion positioned between the second terminal B2 and the third terminal B3. The third electrode layer 317 may correspond to the first terminal B1 of the second variable resistance element 104 of FIG. 1. The first electrode layer 311 and the second electrode layer 312 may be spaced apart from each other in a first direction, for example, in a horizontal direction. The third electrode layer 317 may be disposed between the first electrode layer 311 and the second electrode layer 312 in the horizontal direction, and may be spaced apart from the first and second electrode layers 311 and 312 in a second direction perpendicular to the first direction, for example, in a vertical direction.

The conductive layer 313 may provide an interface capable of changing the magnetization direction of the free layer 314 of the magnetic tunnel junction (MTJ) structure. As indicated by a dotted arrow in the conductive layer 313, a program current I may flow in the conductive layer 313 in a direction parallel to the surface of the conductive layer 313, and may induce the magnetization direction of the free layer 314 to be vertically aligned. That is, the variable resistance element based on some embodiments of the disclosed technology may be an SOT element. Due to the program currents I in opposite directions, the free layer 314 may have magnetization directions in opposite directions. For example, as indicated by arrows in the free layer 314, the free layer 314 may have a magnetization direction from bottom to top or from top to bottom. To this end, the entire surface of the free layer 314 facing the conductive layer 313 may be in contact with a portion of the conductive layer 313. In an embodiment, the conductive layer 313 may be located under the free layer 314, and the entire lower surface of the free layer 314 may be in contact with a portion of the upper surface of the conductive layer 313, but the present disclosure is not limited thereto. In another embodiment, the top and bottom of the MTJ structure may be inverted so that the conductive layer may be positioned over the free layer, and in this case, the entire upper surface of the free layer may be in contact with a portion of the lower surface of the conductive layer. The pinned layer 316 may be disposed to face a surface of the free layer 310, which is opposite to a surface of the free layer 314 in contact with the conductive layer 313, with the tunnel barrier layer 315 interposed therebetween. The pinned layer 316 may have a perpendicular magnetization direction different from the magnetization direction of the free layer 314.

In an embodiment, the free layer 314 and the pinned layer 316 have perpendicular magnetization directions. In another embodiment, a horizontal magnetization direction may be induced in the free layer 314 by the program current I. That is, the free layer 314 may have a magnetization direction from left to right or from right to left. The pinned layer 316 may have a horizontal magnetization direction different from the magnetization direction of the free layer 314.

Referring back to FIG. 1, the first terminal B1 of the second variable resistance element 104 may be connected to the source line SL through the second transistor 114. That is, the second transistor 114 may control the connection between the second variable resistance element 104 and the source line SL. The gate of the second transistor 114 may be connected to the second word line WL2, and may be turned on or turned off according to a voltage applied to the second word line WL2. The second terminal B2 and the third terminal B3 of the second variable resistance element 104 may be connected to the connection layer 120, and may be connected to the bit line BL through the connection layer 120. That is, the connection layer 120 may be connected to the second and third terminals B2 and B3 of the second variable resistance element 104 while extending in a direction toward the first variable resistance element 102 to be connected to the second terminal A2 of the first variable resistance element 102.

As discussed above, since the memory cell includes first and second variable resistance elements 102 and 104 capable of storing 1-bit data, respectively, and two transistors, that is, the first and second transistors 112 and 114, it may be said that one transistor is provided per bit. That is, a 1T memory cell may be implemented. As a result, high integration of a memory device including a plurality of memory cells may be possible.

Figure 4:
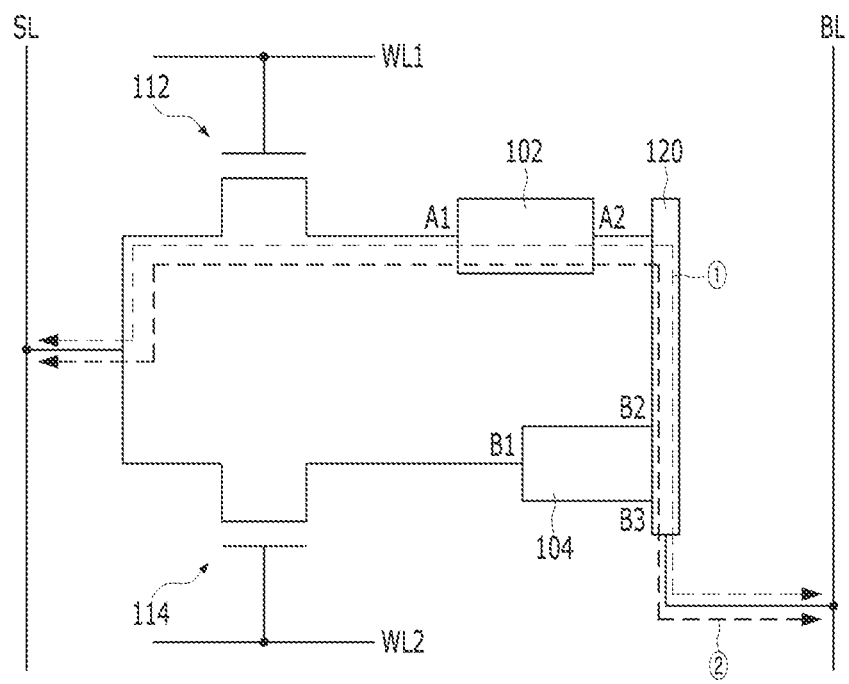
FIG. 4 illustrates a current path when a first variable resistance element of a memory cell of FIG. 1 is driven.
Figure 5:
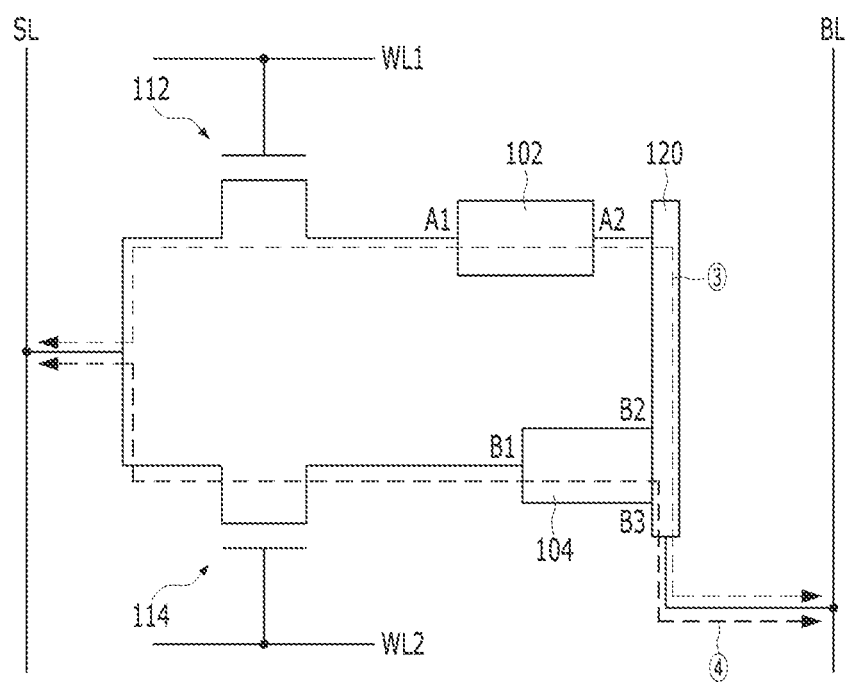
FIG. 5 illustrates a current path when a second variable resistance element of a memory cell of FIG. 1 is driven.

FIGS. 4 and 5 are views illustrating a method of driving a memory cell of FIG. 1. In particular, FIG. 4 illustrates a current path when a first variable resistance element of a memory cell of FIG. 1 is driven, and FIG. 5 illustrates a current path when a second variable resistance element of a memory cell of FIG. 1 is driven.

Referring to FIG. 4, during a program operation in which data of '0' or '1' is stored in the first variable resistance element 102 connected in a 2-terminal configuration, the first transistor 112 may be turned on so that a current path passing through the source line SL, the first transistor 112, the first variable resistance element 102, the connection layer 120, and the bit line BL may be generated (e.g., arrow "①" in FIG. 4). The first variable resistance element 102 may be programmed by a current flowing through the first terminal A1 and the second terminal A2. For example, in some implementations, the current flowing through the MTJ via the terminals A1 and A2 may be a spin polarized current which influences the magnetization direction of the free layer of the MTJ based on a spin torque transfer (STT). In this case, the direction of the current may determine whether the first variable resistance element 102 is programmed as '0' or as '1' (i.e., whether '0' or '1' is written to the first variable resistance element 102). For such a program operation, an appropriate program voltage may be applied through the source line SL and the bit line BL. During this program operation, the second transistor 114 may be turned off.

In addition, during a read operation for reading data stored in the first variable resistance element 102 in the 2-terminal configuration, the first transistor 112 may be turned on so that a current path passing through the source line SL, the first transistor 112, the first variable resistance element 102, the connection layer 120, and the bit line BL may be generated (e.g., arrow "②" in FIG. 4). Data stored in the first variable resistance element 102 may be read out by sensing a current flowing through the first terminal A1 and the second terminal A2 of the first variable resistance element 102. For this read operation, an appropriate read voltage may be applied through the source line SL and the bit line BL. The read voltage may have a magnitude smaller than a magnitude of the program voltage of the first variable resistance element 102. During this read operation, the second transistor 114 may be turned off.

Referring to FIG. 5, during a program operation in which data of '0' or '1' is stored in the second variable resistance element 104 connected in a 3-terminal configuration, the first transistor 112 may be turned on so that a current path passing through the source line SL, the first transistor 112, the first variable resistance element 102, the connection layer 120, and the bit line BL may be generated (e.g., arrow "③" in FIG. 4). The second variable resistance element 104 may be programmed by a current flowing through the second terminal B2 and the third terminal B3 where the current in the conductive layer 312 parallel to the MTJ layers is a spin current generated by the spin Hall effect or the Rashba effect and exerts a spin orbit torque (SOT) on the free layer 314 to manipulate the magnetization of the free layer 314. In this case, the direction of the current may determine whether the second variable resistance element 104 is programmed as '0' or as '1' (i.e., whether '0' or '1' is written to the second variable resistance element 104). For such a program operation, an appropriate program voltage may be applied through the source line SL and the bit line BL. The program voltage of the second variable resistance element 104 may be the same as or different from the program voltage of the first variable resistance element 102. During this program operation, the second transistor 114 may be turned off.

On the other hand, during a read operation in which data stored in the second variable resistance element 104 is read, the second transistor 114 may be turned on so that a current path passing through the source line SL, the second transistor 114, the second variable resistance element 104, the connection layer 120, and the bit line BL may be generated (e.g., arrow "④" in FIG. 4). Data of the second variable resistance element 104 may be read by sensing a current flowing through the first terminal B1 and the third terminal B3 of the second variable resistance element 104. For this read operation, an appropriate read voltage may be applied through the source line SL and the bit line BL. The read voltage may have a magnitude smaller than a magnitude of the program voltage of the second variable resistance element 104. Furthermore, the read voltage of the second variable resistance element 104 may be the same as or different from the read voltage of the first variable resistance element 102. During this read operation, the first transistor 112 may be turned off.

In the case of the second variable resistance element 104, the current path "③" during the program operation and the current path "④" during the read operation may be different. In this case, each of the program operation and the read operation may be independently optimized, and stress on the second variable resistance element 104 may be migrated or prevented during the program operation, so that the reliability of the second variable resistance element 104 may be improved. In addition, since the second variable resistance element 104 can be programmed with a low operating current, a low-power memory cell may be implemented.

Referring to FIGS. 4 and 5, the current path "①" during the program operation of the first variable resistance element 102, the current path "②" during the read operation of the first variable resistance element 102, and the current path "③" during the program operation of the second variable resistance element 104, may be the same. In this case, mutual interference may occur in which the second variable resistance element 104 is affected during the program operation and the read operation of the first variable resistance element 102, or the first variable resistance element 102 is affected during the program operation of the second variable resistance element 104. In order to migrate or prevent such mutual interference, the operations described with reference to FIGS. 6A to 6C below may be performed.

Figure 6A:
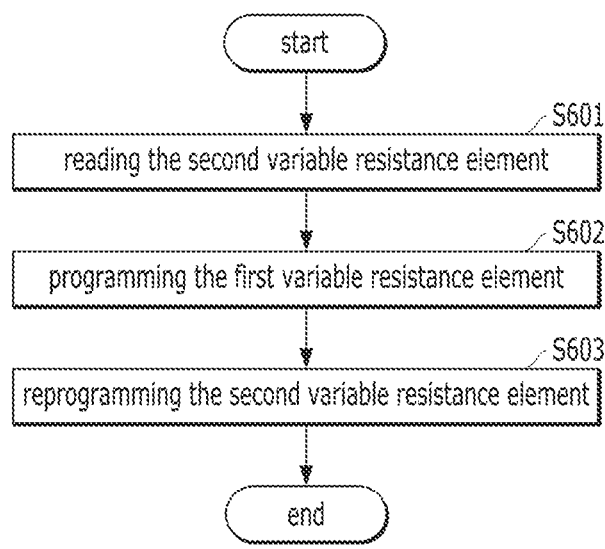
FIG. 6A is a flowchart illustrating a program operation of a first variable resistance element of a memory cell of FIG. 1.

FIG. 6A is a flowchart illustrating a program operation of a first variable resistance element of a memory cell of FIG. 1.

In an embodiment, the magnitude of the first program current flowing through the first variable resistance element 102 during the program operation of the first variable resistance element 102 may be greater than the magnitude of the second program current flowing through the second and third terminals B2 and B3 of the second variable resistance element 104 during the program operation of the second variable resistance element 104. In this case, while the resistance state of the first variable resistance element 102 is not changed during the program operation of the second variable resistance element 104, the resistance state of the second variable resistance element 104 may change undesirably during the program operation of the first variable resistance element 102. The disclosed technology can be implemented in some embodiments to perform the operation described in FIG. 6A, minimizing the undesirable resistance state change.

Referring to FIG. 6A, before the program operation of the first variable resistance element 102, a read operation on the second variable resistance element 104 may be performed (S601). Accordingly, data stored in the second variable resistance element 104 may be verified.

Subsequently, the program operation may be performed on the first variable resistance element 102 (S602). As described above, when the first variable resistance element 102 is programmed, the second variable resistance element 104 may be undesirably affected, and thus there can be an undesirable change in the resistance state of the second variable resistance element 104.

Subsequently, a reprogram operation may be performed on the second variable resistance element 104 (S603). The reprogram operation may refer to an operation of re-storing or re-writing the data to the second variable resistance element 104 verified at S601 to the second variable resistance element 104. Accordingly, the influence applied to the second variable resistance element 104 at S602 may be removed. However, if the data of the second variable resistance element 104 verified in the step S601 is not changed at S602, the operation at S603 does not need to be performed and thus may be omitted.

Figure 6B:
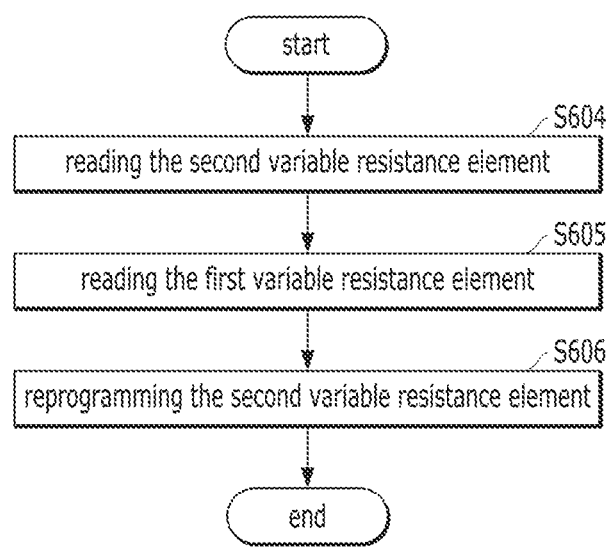
FIG. 6B is a flowchart illustrating a read operation of a first variable resistance element of a memory cell of FIG. 1.

FIG. 6B is a flowchart illustrating a read operation of a first variable resistance element of a memory cell of FIG. 1.

In an embodiment, the magnitude of the first read current flowing through the first variable resistance element 102 during the read operation of the first variable resistance element 102 may be greater than the magnitude of the second program current flowing through the second and third terminals B2 and B3 of the second variable resistance element 104 during the program operation of the second variable resistance element 104. In this case, while the resistance state of the first variable resistance element 102 does not change during the program operation of the second variable resistance element 104, the resistance state of the second variable resistance element 104 may be undesirably changed during the read operation of the first variable resistance element 102. In order to prevent this, the operation described in FIG. 6B may be performed.

Referring to FIG. 6B, before the read operation of the first variable resistance element 102, the read operation on the second variable resistance element 104 may be performed (S604). Accordingly, data stored in the second variable resistance element 104 may be verified.

Subsequently, the read operation on the first variable resistance element 102 may be performed (S605). As described above, when the data stored in the first variable resistance element 102 is read out, the second variable resistance element 104 may be undesirably affected such as the resistance state of the second variable resistance element 104 is changed.

Subsequently, a reprogram operation may be performed on the second variable resistance element 104 (S606). The reprogram operation may refer to an operation of re-storing the data of the second variable resistance element 104 verified in the step S604 to the second variable resistance element 104. Accordingly, the influence applied to the second variable resistance element 104 in the step S605 may be removed. However, if the data of the second variable resistance element 104 verified in the step S604 is not changed at S605, the operation at S606 does not need to be performed and may be omitted.

Figure 6C:
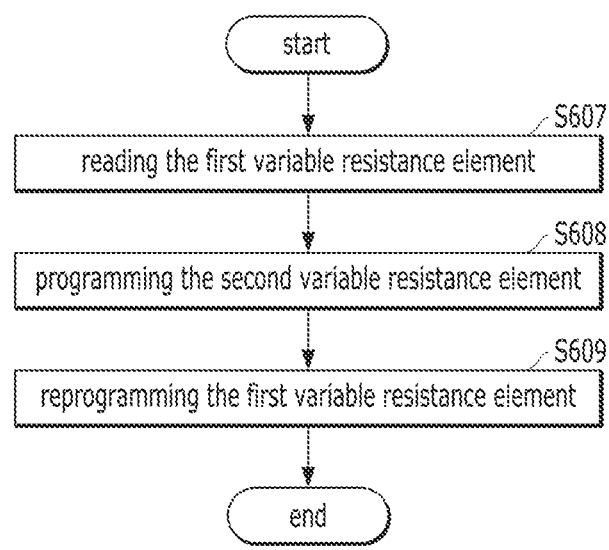
FIG. 6C is a flowchart illustrating a program operation of a second variable resistance element of a memory cell of FIG. 1.

FIG. 6C is a flowchart illustrating a program operation of a second variable resistance element of a memory cell of FIG. 1.

In an embodiment, the magnitude of the second program current flowing through the second and third terminals B2 and B3 of the second variable resistance element 104 during the program operation of the second variable resistance element 104 may be greater than the magnitude of the first program current flowing through the first variable resistance element 102 during the program operation of the first variable resistance element 102. In this case, while the resistance state of the second variable resistance element 104 is not changed during the program operation of the first variable resistance element 102, the resistance state of the first variable resistance element 102 may be undesirably changed during the program operation of the second variable resistance element 104. The disclosed technology can be implemented in some embodiments to perform the operation described in FIG. 6C, minimizing the undesirable resistance state change.

Referring to FIG. 6C, before the program operation of the second variable resistance element 104, the read operation on the first variable resistance element 102 may be performed (S607). Accordingly, data stored in the first variable resistance element 102 may be verified.

Subsequently, the program operation may be performed on the second variable resistance element 104 (S608). As described above, when the second variable resistance element 104 is programmed, the first variable resistance element 102 may be undesirably affected, such as a change in the resistance state of the first variable resistance element 102.

Subsequently, a reprogram operation may be performed on the first variable resistance element 102 (S609). The reprogram operation may refer to an operation of re-storing or re-writing the data to the first variable resistance element 102 verified in the step S607 to the first variable resistance element 102. Accordingly, the influence applied to the first variable resistance element 102 in the step S608 may be removed. However, if the data of the first variable resistance element 102 verified at S607 is not changed at S608, the operation at S609 does not need to be performed and may be omitted.

Figure 7:
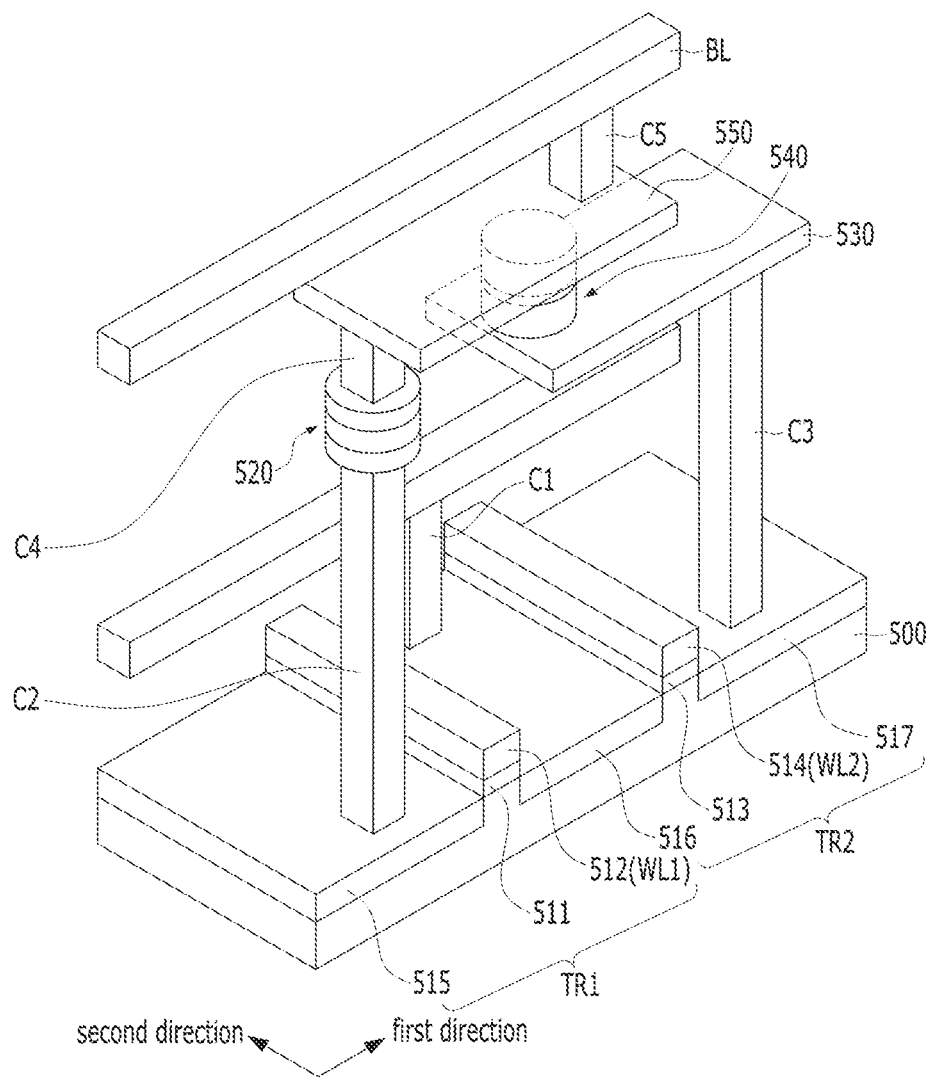
FIG. 7 is a perspective view illustrating a memory device based on some embodiments of the disclosed technology.
Figure 8:
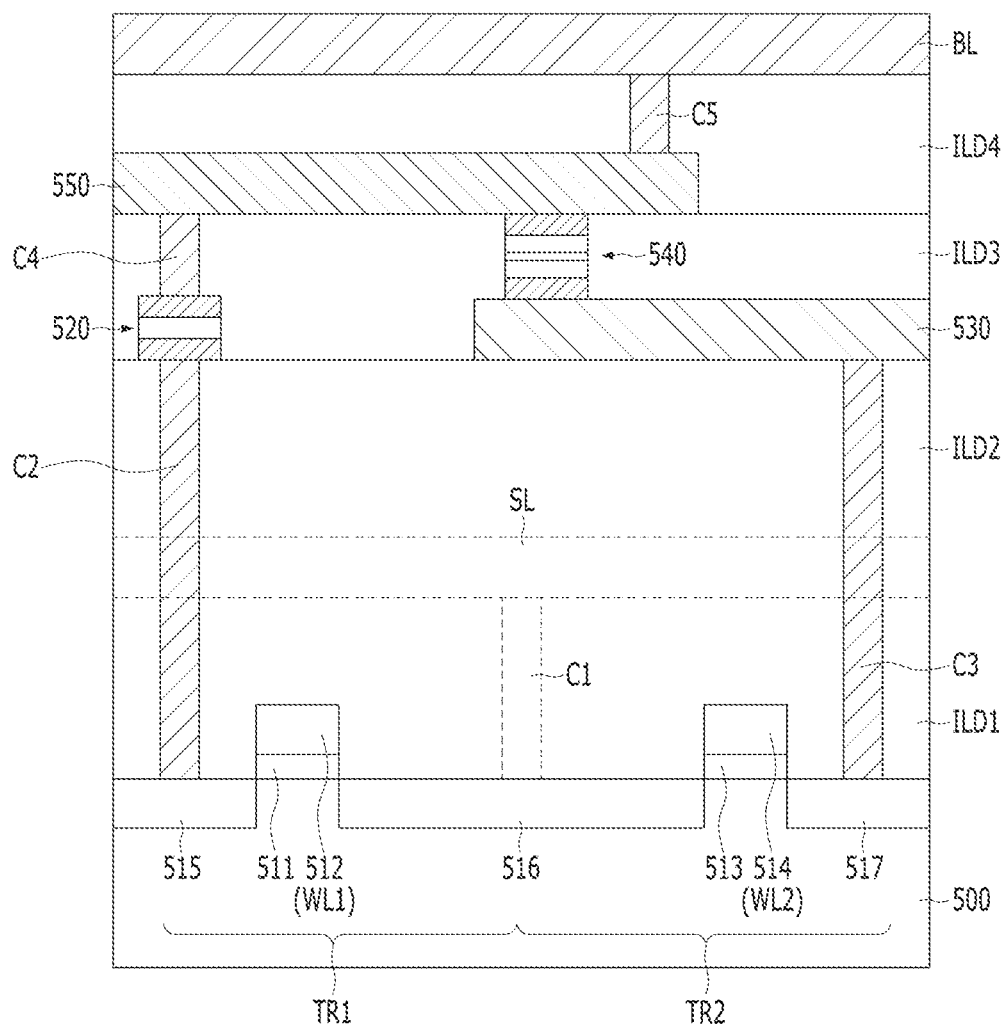
FIG. 8 is a cross-sectional view corresponding to FIG. 7, in a first direction.

FIG. 7 is a perspective view illustrating a memory device based on some embodiments of the disclosed technology, and FIG. 8 is a cross-sectional view corresponding to FIG. 7, in a first direction.

Referring to FIGS. 7 and 8, the memory device based on some embodiments of the disclosed technology may include a first transistor TR1 and a second transistor TR2 formed in a substrate 500, a first variable resistance element 520 having a one end electrically connected to one end of the first transistor TR1, a second variable resistance element 540 having one end electrically connected to one end of the second transistor TR2, a source line SL electrically connected the other ends of the first and second transistors TR1 and TR2, a connection layer 550 electrically connected to the other end of the first variable resistance element 520 while being in contact with the other end of the second variable resistance element 540, and a bit line BL electrically connected to the connection layer 550.

The substrate 500 may include various semiconductor materials such as silicon. Junction regions 515, 516, and 517 of the first and second transistors TR1 and TR2 may be formed in the substrate 500. The junction regions 515, 516, and 517 may be formed by doping impurities into the substrate 500.

A first gate electrode 512 and a second gate electrode 514 may be formed over the substrate 500. The first gate electrode 512 and the second gate electrode 512 may be spaced apart from each other in a first direction while extending in a second direction. The first gate electrode 512 may form a first word line WL1, and the second gate electrode 514 may form a second word line WL2. A first gate insulating layer 511 may be interposed between the first gate electrode 512 and the substrate 500, and a second gate insulating layer 513 may be interposed between the second gate electrode 514 and the substrate 500.

The two junction regions 515 and 516 may be positioned on both sides of the first gate electrode 512, respectively. The first gate electrode 512, the first gate insulating layer 511, and the two junction regions 515 and 516 on both sides of the first gate electrode 512 may form the first transistor TR1. The two junction regions 516 and 517 may be positioned on both sides of the second gate electrode 514, respectively. The second gate electrode 514, the second gate insulating layer 513, and the two junction regions 516 and 517 on both sides of the second gate electrode 514 may form the second transistor TR2. The junction region 516 between the first gate electrode 512 and the second gate electrode 514 may be shared by the first and second transistors TR1 and TR2. Hereinafter, the junction region 515 will be referred to as a drain region of the first transistor TR1, the junction region 517 will be referred to as a drain region of the second transistor TR2, and the junction region 516 will be referred to as a common source region of the first and second transistors TR1 and TR2.

A first interlayer insulating layer ILD1 having a thickness covering the first and second gate electrodes 512 and 514 may be formed over the substrate 500.

The source line SL may be formed over the first interlayer insulating layer ILD1. The source line SL may extend in the first direction and may be connected to the common source region 516 through a first contact plug C1 penetrating the first interlayer insulating layer ILD1.

A second interlayer insulating layer ILD2 having a thickness covering the source line SL may be formed over the first interlayer insulating layer ILD1.

The first variable resistance element 520 may be formed over the second interlayer insulating layer ILD2. The first variable resistance element 520 may be connected to the drain region 515 of the first transistor TR1 through a second contact plug C2 penetrating the first and second interlayer insulating layers ILD1 and ILD2.

In addition, the second variable resistance element 540 may be formed over the second interlayer insulating layer ILD2. The second variable resistance element 540 may be connected to the drain region 517 of the second transistor TR2 through a conductive pattern 530 and a third contact plug C3 penetrating the first and second interlayer insulating layers ILD1 and ILD2. The conductive pattern 530 may be for adjusting the horizontal position of the second variable resistance element 540. For example, in order to facilitate the formation of the connection layer 550 connecting the second variable resistance element 540 and the first variable resistance element 520, the conductive pattern 530 may have a line shape extending in a direction from the third contact plug C3 toward the first variable resistance element 520, and the second variable resistance element 540 may be positioned at the end portion of the conductive pattern 530. Accordingly, the first variable resistance element 520 may overlap the second contact plug C2, while the second variable resistance element 540 may not overlap the third contact plug C3. The conductive pattern 530 may be omitted, and in this case, the second variable resistance element 540 may overlap and directly contact the third contact plug C3.

A third interlayer insulating layer ILD3 may be formed over the second interlayer insulating layer ILD2. The third interlayer insulating layer ILD3 may have a thickness to cover the first variable resistance element 520 and expose the upper surface of the second variable resistance element 540.

The connection layer 550 may be formed over the third interlayer insulating layer ILD3. The connection layer 550 may be connected to the upper surface of the first variable resistance element 520 through a fourth contact plug C4 penetrating the third interlayer insulating layer ILD3. In addition, the connection layer 550 may be in contact with the entire upper surface of the second variable resistance element 540 exposed by the third interlayer insulating layer ILD3.

A fourth interlayer insulating layer ILD4 having a thickness covering the connection layer 550 may be formed over the third interlayer insulating layer ILD3.

The bit line BL may be formed over the fourth interlayer insulating layer ILD4. The bit line BL may extend in the first direction and may be connected to the connection layer 550 through a fifth contact plug C5 penetrating the fourth interlayer insulating layer ILD4.

In the present embodiment, each of the first to fifth contact plugs C1 to C5 is illustrated as having a single pillar shape, but the present disclosure is not limited thereto. In another embodiment, each of the first to fifth contact plugs C1 to C5 may be formed by a combination of a plurality of conductive patterns. Each of the plurality of conductive patterns may have a pillar shape or a plate shape which has an area larger than the pillar shape and a height lower than the pillar shape.

Also, in the present embodiment, the first variable resistance element 520 is illustrated as being positioned over the second interlayer insulating layer ILD2, but the present disclosure is not limited thereto. In another embodiment, the first variable resistance element 520 may be positioned at various heights on the assumption that it is positioned above the upper surface of the substrate 500 and below the lower surface of the connection layer 550. If the first variable resistance element 520 can be driven by two terminals, the upper surface of the first variable resistance element 520 may directly contact the lower surface of the connection layer 550. In this case, the fourth contact plug C4 may be omitted. On the other hand, since the upper surface of the second variable resistance element 520 is in direct contact with the connection layer 550, the second variable resistance element 520 may be positioned directly under the connection layer 550.

In the memory device described above, in some embodiments, the first and second variable resistance elements 520 and 540 may be driven by the first and second transistors 512 and 514, and additional lines other than the source line SL and the bit line BL, the first word line WL1, and the second word line WL2 are unnecessary. As a result, a highly integrated memory device may be obtained.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor memory comprising:
    a first variable resistance element including a first terminal and a second terminal;
    a second variable resistance element including a first terminal, a second terminal, and a third terminal;
    a first transistor configured to control an electrical connection between a first conductive line and the first terminal of the first variable resistance element;
    a second transistor configured to control an electrical connection between the first conductive line and the first terminal of the second variable resistance element;
    a connection layer structured to electrically connect the second terminal of the first variable resistance element to the second and third terminals of the second variable resistance element; and
    a second conductive line is electrically connected to the connection layer,
    wherein a read current flows through the first and second terminals of the first variable resistance element to read out data from the first variable resistance element, and a program current flows through the second and third terminals of the second variable resistance element to write data to the second variable resistance element,
    wherein a magnitude of the read current is greater than a magnitude of the program current,
    wherein a read operation of the second variable resistance element is performed to read out data from the second variable resistance element before reading out data from the first variable resistance element, and
    wherein a reprogram operation of the second variable resistance element to write data to the second variable resistance element is performed after reading out data from the first variable resistance element.

2. The semiconductor memory according to claim 1, wherein data is written to or read out from the first variable resistance element by a current flowing through the first and second terminals of the first variable resistance element, and
    wherein the data is written to the second variable resistance element by a current flowing through the second and third terminals of the second variable resistance element, and the data is read out by a current flowing through the first and third terminals of the second variable resistance element.

3. The semiconductor memory according to claim 1, wherein the first transistor is turned on and the second transistor is turned off to: write data to the first variable resistance element; read out data from the first variable resistance element; or write data to the second variable resistance element, and
    wherein the first transistor is turned off and the second transistor is turned on to read out data from the second variable resistance element.

4. The semiconductor memory according to claim 1, wherein data is written to the first variable resistance element through a first current path, the data is read out from the first variable resistance element through a second current path, and the data is written to the second variable resistance element through a third current path, and wherein the first, second, and third current paths are identical to each other,
    wherein the data is read out from the second variable resistance element through a fourth current path, and
    wherein the fourth current path is different from the first to third current paths.

5. The semiconductor memory according to claim 4, wherein each of the first to third current paths flows through the first conductive line, the first transistor, the first variable resistance element, the connection layer, and the second conductive line, and
    wherein the fourth current path flows through the first conductive line, the second transistor, the second variable resistance element, the connection layer, and the second conductive line.

6. The semiconductor memory according to claim 1, wherein a first program current flows through the first and second terminals of the first variable resistance element to write data to the first variable resistance element, and a second program current flows through the second and third terminals of the second variable resistance element to write data to the second variable resistance element, wherein a magnitude of the first program current is greater than a magnitude of the second program current,
  wherein a read operation of the second variable resistance element is performed to read out data from the second variable resistance element before writing data to the first variable resistance element, and
  wherein a reprogram operation of the second variable resistance element is performed to write data to the second variable resistance element after writing data to the first variable resistance element.

7. A semiconductor memory comprising:
  a first variable resistance element including a first terminal and a second terminal;
  a second variable resistance element including a first terminal, a second terminal, and a third terminal;
  a first transistor configured to control an electrical connection between a first conductive line and the first terminal of the first variable resistance element;
  a second transistor configured to control an electrical connection between the first conductive line and the first terminal of the second variable resistance element;
  a connection layer structured to electrically connect the second terminal of the first variable resistance element to the second and third terminals of the second variable resistance element; and
  a second conductive line is electrically connected to the connection layer, wherein a first program current flows through the first and second terminals of the first variable resistance element to write data to the first variable resistance element, and a second program current flows through the second and third terminals of the second variable resistance element to write data to the second variable resistance element, wherein a magnitude of the first program current is smaller than a magnitude of the second program current,
  wherein a read operation of the first variable resistance element is performed to read out data from the first variable resistance element before writing data to the second variable resistance element, and
  wherein a reprogram operation of the first variable resistance element is performed to write data to the first variable resistance element after writing data to the second variable resistance element.

8. The semiconductor memory according to claim 1, wherein the first variable resistance element includes a metal oxide, a phase change material, a ferroelectric material, or a spin transfer torque (STT) element, and
  wherein the second variable resistance element includes a spin orbit torque (SOT) element.

9. A semiconductor memory comprising:
  a first transistor including a first gate electrode that is disposed over a substrate;
  a second transistor including a second gate electrode that is disposed over the substrate;
  a first variable resistance element disposed over the substrate and electrically connected to a first terminal of the first transistor;
  a second variable resistance element disposed over the substrate and electrically connected to a first terminal of the second transistor;
  a source line disposed over the substrate and electrically connected in common to a second terminal of the first transistor and a second terminal of the second transistor;
  a connection layer disposed over the first and second variable resistance elements and electrically connected to the first variable resistance element while being in contact with an entire upper surface of the second variable resistance element;
  a bit line disposed over the connection layer and electrically connected to the connection layer;
  a first contact plug structured to connect the source line to the second terminal of the first transistor and the second terminal of the second transistor;
  a second contact plug structured to connect the first variable resistance element to the first terminal of the first transistor;
  a third contact plug structured to connect the second variable resistance element to the first terminal of the second transistor; and
  a fifth contact plug structured to connect the bit line to the connection layer.

10. The semiconductor memory according to claim 9, further comprising:
  a fourth contact plug disposed between the first variable resistance element and the connection layer and connecting the first variable resistance element to the connection layer.

11. The semiconductor memory according to claim 9, wherein the first transistor includes a first junction region and a second junction region formed in the substrate on both sides of the first gate electrode,
  wherein the second transistor includes the second junction region and a third junction region formed in the substrate on both sides of the second gate electrode, and
  wherein the second junction region is shared by the first and second transistors.

12. The semiconductor memory according to claim 11, wherein the first contact plug is connected to the second junction region,
  wherein the second contact plug is connected to the first junction region, and
  wherein the third contact plug is connected to the third junction region.

13. The semiconductor memory according to claim 9, further comprising:
  a conductive pattern interposed between the third contact plug and the second variable resistance element.

14. The semiconductor memory according to claim 13, wherein the conductive pattern is connected to the third contact plug and extends in a direction toward the first variable resistance element.

15. The semiconductor memory according to claim 13, wherein the first variable resistance element is disposed at a position overlapping the second contact plug, and
  wherein the second variable resistance element is disposed over the conductive pattern at a position not overlapping the third contact plug.

* * * * *